United States Patent
Kim et al.

(10) Patent No.: US 6,603,360 B2
(45) Date of Patent: Aug. 5, 2003

(54) PHASE LOCKED LOOP CIRCUIT FOR A FRACTIONAL-N FREQUENCY SYNTHESIZER

(75) Inventors: Sang-Young Kim, Euijungboo (KR); Pil-Jae Jun, Suwon (KR)

(73) Assignee: Samsung Electronics Co., Ltd. (KR)

( * ) Notice: Subject to any disclaimer, the term of this patent is extended or adjusted under 35 U.S.C. 154(b) by 43 days.

(21) Appl. No.: 10/038,299

(22) Filed: Jan. 4, 2002

(65) Prior Publication Data

US 2002/0163389 A1 Nov. 7, 2002

(30) Foreign Application Priority Data

Mar. 23, 2001 (KR) .......................................... 2001-15161

(51) Int. Cl.[7] .................................................. H03L 7/00
(52) U.S. Cl. ............................ 331/1 A; 331/16; 331/25; 327/115
(58) Field of Search ........................... 331/1 A, 16, 25; 327/115, 117, 156, 157, 158, 159

(56) References Cited

U.S. PATENT DOCUMENTS

| | | | | |
|---|---|---|---|---|
| 4,849,714 A | * | 7/1989 | Takahashi et al. | 331/1 A |
| 5,521,948 A | * | 5/1996 | Takeuchi | 375/376 |
| 5,818,303 A | | 10/1998 | Oishi et al. | 331/1 A |
| 5,821,816 A | * | 10/1998 | Patterson | 331/1 A |
| 5,977,838 A | * | 11/1999 | Nagoya et al. | 331/17 |
| 6,049,255 A | * | 4/2000 | Hagberg et al. | 331/17 |
| 6,064,272 A | * | 5/2000 | Rhee | 331/16 |
| 6,236,278 B1 | * | 5/2001 | Olgaard | 331/25 |

FOREIGN PATENT DOCUMENTS

JP 10-032486 * 2/1998

OTHER PUBLICATIONS

Brian Miller and Robert Conley, A Multiple Modulator Fractional Divider, IEEE Transactions on Instrumentation And Measurement, vol. 40, No. 3, Jun. 1991, pp. 578–583.

* cited by examiner

*Primary Examiner*—Henry Choe
(74) *Attorney, Agent, or Firm*—Mills & Onello, LLP

(57) ABSTRACT

A phase locked loop (PLL) circuit for synchronizing a fractional-N frequency synthesizer employs an interpolation method. However, by limiting the number of delay signals to 8 and by using the phase accumulation method during the four cycles of the feedback signal in response to the fractional division ratio data, it is possible to perform the divide-by-fraction, for example, F/32 (F=0, 1, 2, . . . , 31). According to the present invention, the substrate noise is decreased in comparison with the phase interpolation method using 32 delay signals, and the PLL circuit is insensitive to physical error. While a method of accumulating the phases during 32 cycles is in need of an additional compensating circuit so as to minimized fractional spurious, the PLL circuit of the present invention does not require additional compensation circuits, by employing the inventive method of accumulating phases during a predetermined number of cycles, for example four.

16 Claims, 9 Drawing Sheets

PHASE LOCKED LOOP CIRCUIT FOR A FRACTIONAL-N FREQUENCY SYNTHESIZER

This application relies for priority upon Korean Patent Application No. 2001-15161, filed on Mar. 23, 2001, the contents of which are herein incorporated by reference in their entirety.

FIELD OF THE INVENTION

The present invention relates to the field of a phase locked loop (PLL) circuit, and more particularly to a PLL circuit for a fractional-N frequency synthesizer.

BACKGROUND OF THE INVENTION

FIG. 1 is a circuit diagram showing a configuration of a conventional phase locked loop (PLL) circuit having an integer frequency divider. Referring to FIG. 1, a phase-frequency comparator 10 receives a reference signal (i.e. input signal) Fin and a feedback signal Ffeed, which is obtained by dividing an output signal Fout of a voltage controlled oscillator (VCO) 40 by a frequency divider 50. The phase-frequency comparator 10 detects a phase error between the Fin and Ffeed, and outputs pulse signals UP and DN corresponding to the phase error. A charge pump 20 generates a charge pump output current Icp in response to the pulse signals UP and DN. The charge pump output current Icp flows to a loop filter 30. The loop filter 30 removes a high frequency constituent of the Icp, and outputs a control voltage Vctrl in proportion to the inputted current Icp. The VCO 40 generates the output signal Fout in proportion to the control voltage Vctrl of the loop filter 30. The output signal of the VCO 40 is divided by N, that is, multiplied by 1/N, by the frequency divider 50, and is fed back to the phase-frequency comparator 10 as the feedback signal Ffeed. Accordingly, the output signal Fout of the VCO 40 can be described by the following equation (1).

$$Fout = N \times Fin \quad (1)$$

Here, a division ratio N of the frequency divider 50 is a positive integer. Therefore, the PLL circuit can obtain the output signal Fout having a frequency that are N times higher than that of the reference signal Fin. For the reason, the frequency of the output signal Fout can be divided by the integer N.

In the PLL circuit, it is possible to raise the frequency of the Fin or to increase the division ratio N for improving the circuit's capacity for locking phases. If the frequency of the Fin is raised in order to improve the capacity of locking phases, the frequency interval of Fout is also increased. In a communication unit, an increase of the frequency interval of the signal Fout can cause a corresponding decrease in the number of usable frequency bands.

In order to maintain the frequency of the output signal, while, at the same time, lowering the frequency of the reference signal, it is necessary to increase the division ratio N. However, a high division ratio causes an increase in phase noise by drawing the loop band close to the carrier frequency. Generally, the phase noise increases along the dimension of log scale of the division ratio (about 20 logN).

In order to solve the above problem, a fractional-N frequency PLL circuit is proposed in the present invention. In the fractional-N frequency PLL circuit, the frequency interval of the output signal Fout is smaller than that of the reference signal Fin.

For example, in the PLL circuit, in the case that among the total number of division K, the input signal or the reference signal is divided by division ratio N+1 in F times, and is divided by division ratio N in K−F times, an average frequency of signal outputted from the VCO can be described by the following equation (2).

$$F_{out} = \frac{(F \times (N+1)) + ((K-F) \times N)}{K} = N + \frac{F}{N} \quad (2)$$

That is, it is possible to be divided by not only N but also F/K. The output signal Fout converges on an average value through the loop filter 30 composing a resistor 31 and a capacitor 32, and thereby a fractional division can be performed.

The fractional-N frequency PLL circuit can be embodied by using a phase accumulating circuit having a compensating circuit, a sigma delta modulator, phase interpolation, and the like.

The fractional-N frequency PLL circuit using a phase accumulating method is limited by phase that accumulates in an accumulator. This, in turn, causes increase in spurious noise or fractional noise as much as the accumulated phase. In order to solve this problem, the bandwidth of the system can be reduced. However, in this case, there is no need for the fractional-N frequency synthesizer to be used. Therefore, the frequency synthesizer has been developed to employ a circuit for compensating for spurious noise or a spurious signal cancellation circuit. This concept is proposed in U.S. Pat. No. 5,818,303 "Fractional N-frequency Synthesizer and Spurious Signal Cancel Circuit". Since the phase accumulating circuit requires the additional compensation circuit, the size of the circuit is therefore increased.

A noise regulating method used in the high order sigma-delta modulator is able to suppress fractional spurious signals. An example of the noise regulating method is proposed in "A Multiple Modulator Fractional Divider" (B. Miller and R. J. Conley, IEEE Transactions on Instrumentation and Measurement. Vol. 40, pp. 578–583, June 1991). The proposed noise regulating method decreases a phase error from a phase-frequency comparator, resulting in eliminating the phase error of low frequencies by rapidly switching different division ratios. However, in this case, it is possible to generate a phase error in not only a negative pole but also in a positive pole.

The method of the phase interpolation causes the VCO output signal to be a plurality of signals with the same delay time and different phases, and divides the signals using each delay time. However, since each delay time should be identical, a delicate arrangement technology is required for the phase interpolation method. Further, the resulting increase in the number of output signals causes a corresponding increase in substrate noise and noise generated by physical conditions.

SUMMARY OF THE INVENTION

The object of the present invention is to provide an improved phase locked loop (PLL) circuit for a fractional-N frequency synthesizer so as to address the limitations of conventional approaches.

According to an aspect of the present invention, the PLL circuit for a fractional frequency division synthesizer includes a voltage controlled oscillator (VCO) for generating an output signal of a frequency in proportion to a predetermined frequency control voltage, and for generating a clock signal delayed by a time period corresponding to fractional division control data, an integer division logic circuit for generating a feedback signal by dividing a is delayed clock signal supplied from the VCO in response to an integer division ratio data from external sources and a predetermined division ratio, a phase comparator for detecting a phase error between an input signal and the feedback signal, and for generating a phase error signal corresponding to the phase error, a charge pump circuit for generating a charge pump output current corresponding to the phase error signal, and a loop filter for converting the charge pump output current to the frequency control voltage.

The delayed clock signal generated y the VCO may comprise a fractional divided clock signal.

The VCO may include an oscillator for an output signal of frequency in proportion to the frequency control voltage, and for generating delay signals of $2^Y$ numbers (Y is a positive integer) delayed a predetermined time comparing with the output signal, and a switching circuit for generating the delayed clock signal from one of the $2^Y$ delay signals in response to the fractional division control data.

In a preferred embodiment, each delay signal has a similar delay time, and the sum of delay times of each delay signal is equal to a cycle of the output signal. Further, only one of said $2^Y$ fractional division control data bits has a value of logic '1' exclusively.

The switching circuit is composed of $2^Y$ switches respectively corresponding to the delay signals generated from the oscillator, where each switch is controlled by the corresponding fractional division control data bit, and transfers the delay signal generated from the oscillator to the delayed clock signal.

The fractional division ratio data is composed of X-bits (X is a positive integer). The fractional division control logic circuit includes a second counter, a third counter, a decoder, and a latch circuit, where the second counter performs counting operations in synchronously response to the feedback signal and compares an internal count value with a high-order bit (X-Y) of the fractional division ratio data, resulting in generating a second control signal, the third counter performs counting operations during time corresponding to a value adding the second control signal to a low-order bit of the fractional division ratio data, and thereby generating a count value, the decoder generates a decoding data from the count value of the third counter, and the latch circuit generates in synchronous response to the delayed clock signal the fractional division control data from the decoding data.

The second counter generates the second control signal of logic '1' if the internal count value is lower than the high-order bit (X-Y) of the fractional division ratio data, and generates the second control signal of logic '0' if the internal count value is equal to or greater than the high-order bit (X-Y).

The integer division logic circuit includes a dual modulus prescaler, a frequency divider, and a first counter, where the dual modulus prescaler selects one of predetermined plural division ratios in response to a first control signal, and divides the clock signal divided by the selected division ratio, resulting in generating a first division signal, the frequency divider divides the first division signal in response to the integer division ratio data, and generates the feedback signal, and the first counter performs counting operations in synchronously response to the feedback signal, and compares the internal count value with a critical value supplied from external sources, resulting in generating the first control signal.

The first counter generates the first control signal having logic '1' if the internal count value is lower than the critical value supplied from external sources, and generates the first control signal having logic '0' if the internal count value is equal to or greater than the critical value.

Further, the first counter may be formed of a swallow counter.

BRIEF DESCRIPTION OF THE DRAWINGS

The present invention will be more clearly understood from the description of the preferred embodiments as set forth below with reference to the accompanying drawings, wherein.

DETAILED DESCRIPTION OF PREFERRED EMBODIMENTS

Referring now to FIGS. 2 to 8, embodiments of the present invention will be described below.

Figure 1:
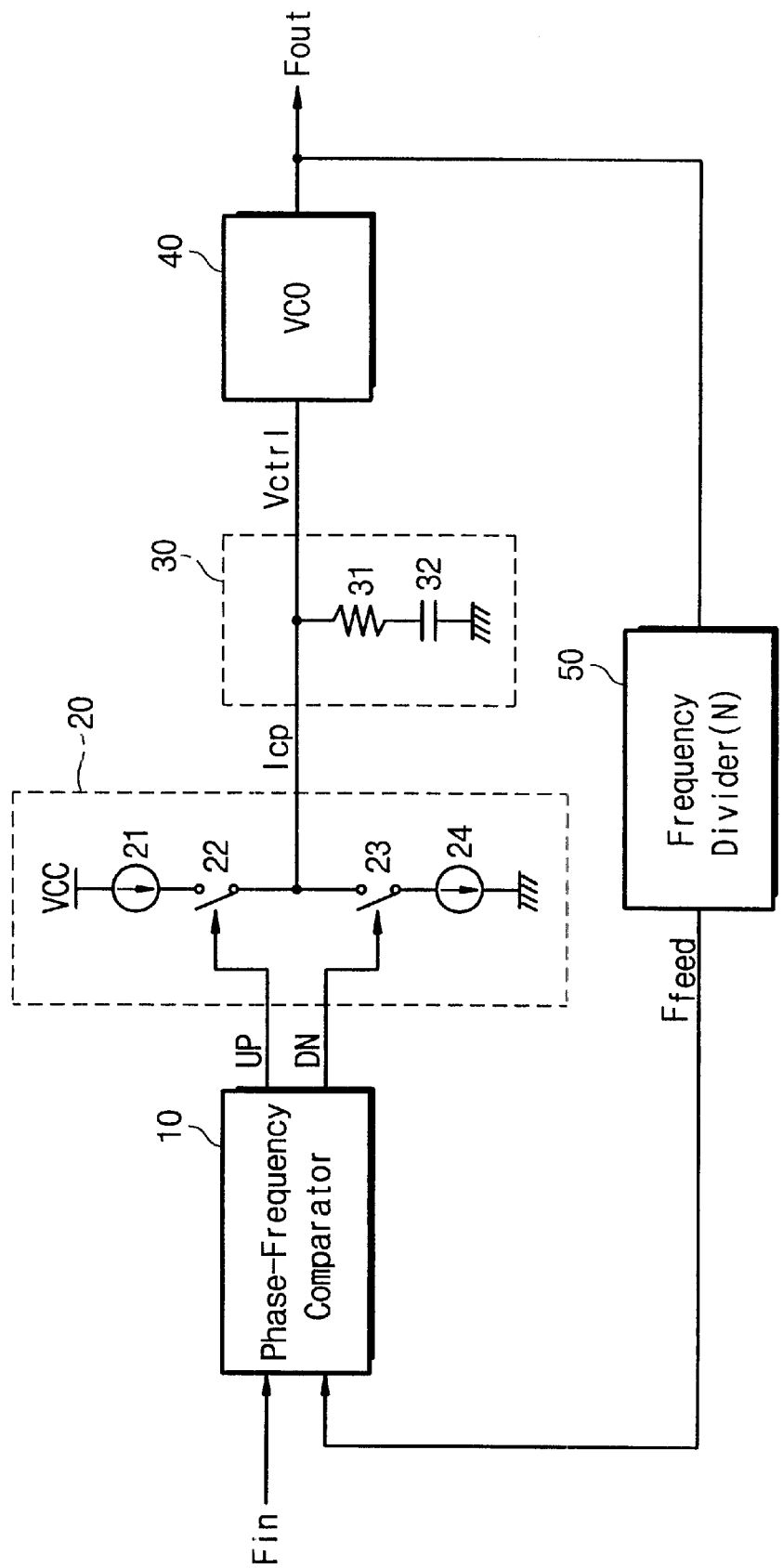
FIG. 1 is a block diagram illustrating a conventional phase locked loop (PLL) with an integer frequency divider.
Figure 2:
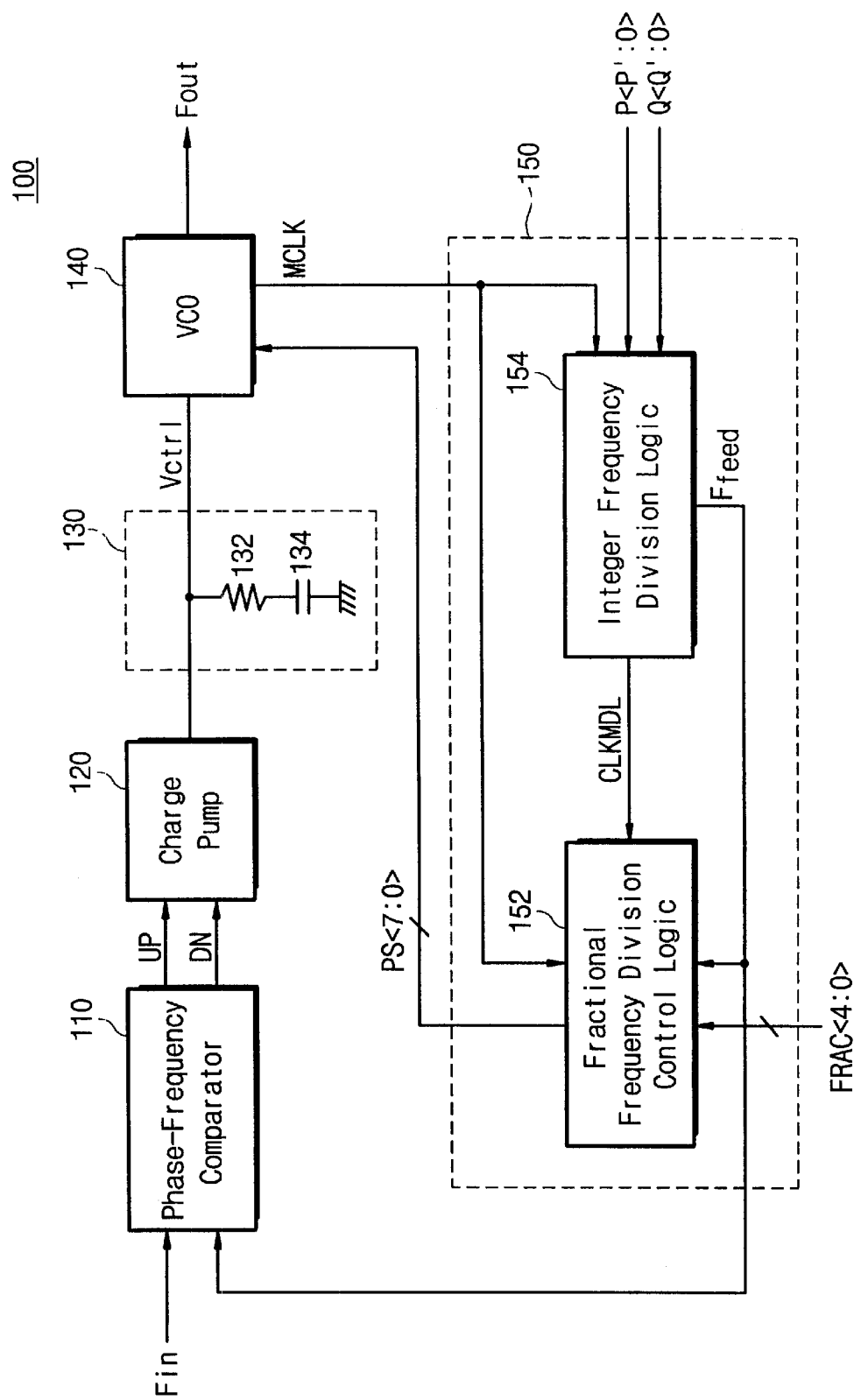
FIG. 2 is a block diagram illustrating a preferred embodiment of the PLL in accordance with the present invention.

FIG. 2 is a block diagram illustrating a preferred embodiment of a PLL in accordance with the present invention. Referring to FIG. 2, a phase-frequency comparator 110 detects a phase error between an input or reference signal Fref and a feedback signal Ffeed, and outputs pulse signals UP and DN corresponding to the phase error. A charge pump 120 generates a charge pump output current Icp in response to the pulse signals UP and DN. The charge pump output current Icp is filtered by a loop filter 130, and is converted to a control voltage Vctrl therein. A voltage controlled oscillator (VCO) 140 is controlled by the voltage Vctrl of the loop filter 130, and outputs an output signal Fout of frequency proportioned to the Vctrl. In particular, the VCO in accordance with the preferred embodiment of the present invention outputs a clock signal MCLK that is delayed (i.e. divided by decimal fraction) in comparison with the output signal Fout as time corresponding to a value of a fractional division control data PS<7:0> from a frequency divider 150. The fractionally divided MCLK, following division by an integer N at the frequency divider 150, is fed back to the phase-frequency comparator 110.

Figure 3:
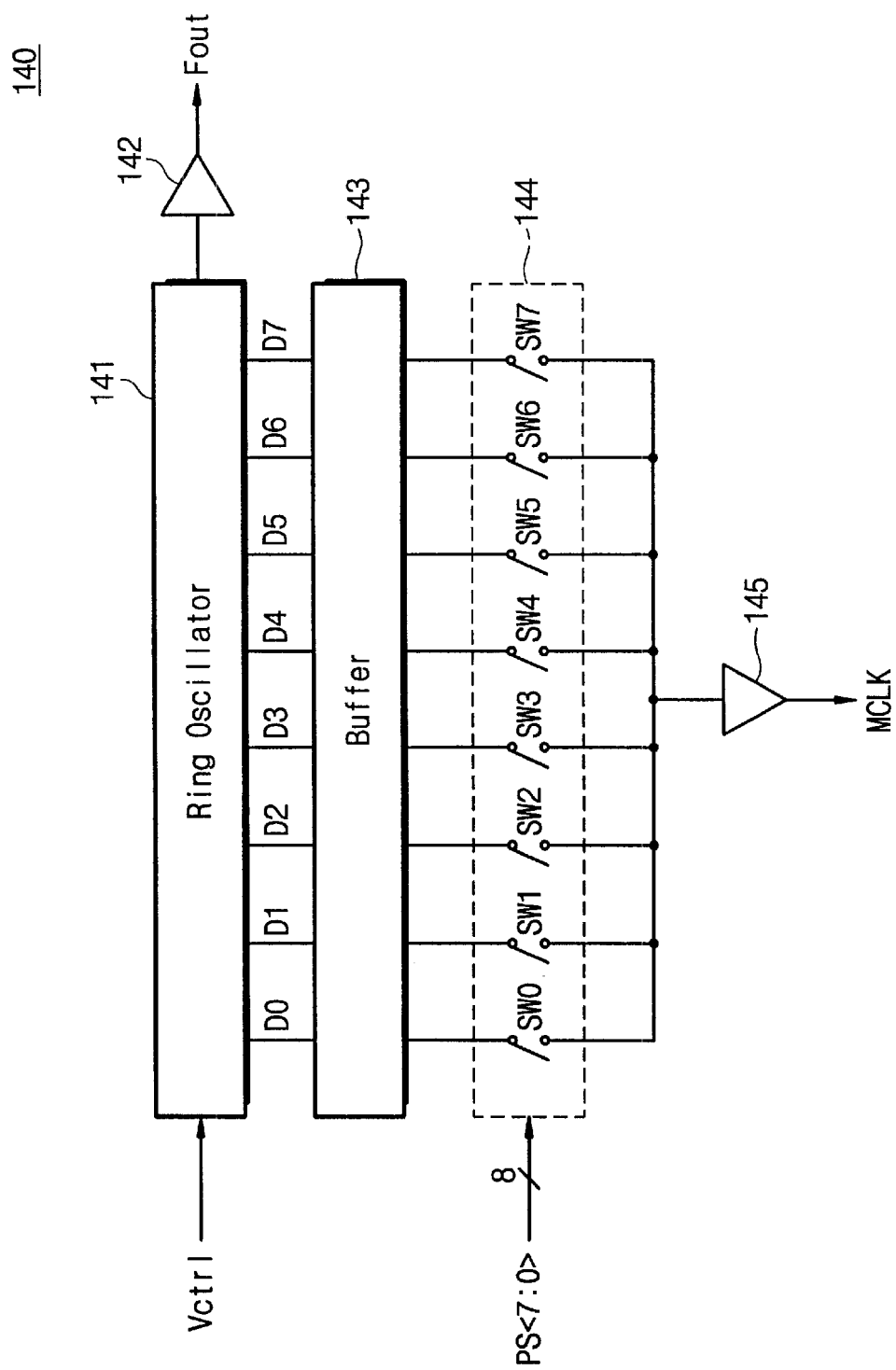
FIG. 3 is a circuit diagram illustrating a voltage controlled oscillator (VCO) of FIG. 2.
Figure 4:
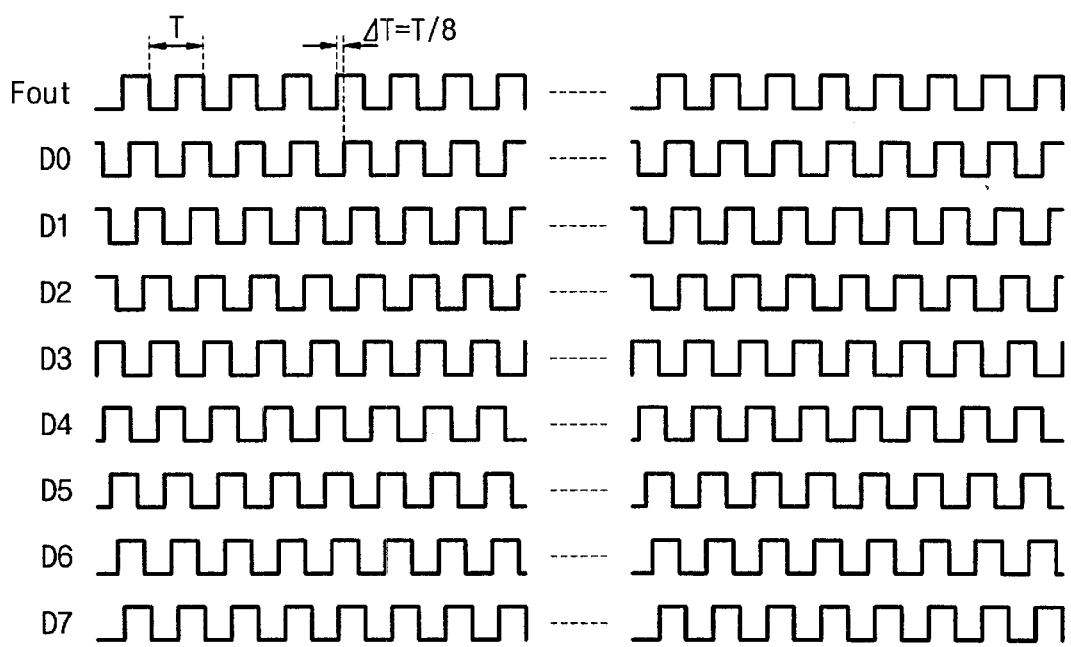
FIG. 4 is a timing diagram illustrating delay signals of FIG. 3.

FIG. 3 is a circuit diagram illustrating a detailed configuration of the VCO 140 shown in FIG. 2. Referring to FIG. 3, a ring oscillator 141 generates the output signal Fout in proportion to the voltage control signal Vctrl from the loop filter 130, and generates delay signals D0–D7 delayed by a predetermined time period with respect to the output signal Fout. FIG. 4 is a timing diagram of the delay signals D0–D7. Referring to FIG. 4, each delay signal Di [i=0, 1, . . . , 7] has a delay time of ΔT*(i+1) [i=0, 1, . . . , 7] corresponding to the reference signal Fout. In the case where a cycle of the Fout signal is T, the delay time ΔT of each delay signal D0–D7 is a value that the cycle of the Fout is divided by 8, i.e. T/8.

With the eight delay signals D0–D7 delayed by a predetermined time interval from the signal Fout, the fractional frequency division can be competed with high-efficiency, while permitting a relatively small delay error between them.

The PLL circuit of the present invention, as shown in FIG. 3, uses a phase interpolation method using only eight delay signals. Nevertheless, the PLL circuit of the present invention provides a fractional frequency division by F/32 (F=0, 1, 2, . . . , 31), which will now be described in detail.

Referring to FIG. 3 again, the delay signals D0–D7 generated from the ring oscillator 141 are transmitted to corresponding switches SW0–SW7 of a switch array 144 via a buffer 143. Each eight switch SW0–SW7 is controlled by an 8-bit fractional frequency control data signal PS<7:0>. At a predetermined time, only one of the 8-bit fractional frequency control data bits PS<7:0> has a logic '1' (or '0') exclusively. Therefore, among the eight delay signals D0–D7, only one delay signal corresponding to the 8-bit fractional frequency control data PS<7:0> is output as a clock signal MCLK divided by fraction via an output buffer 145.

Figure 5:
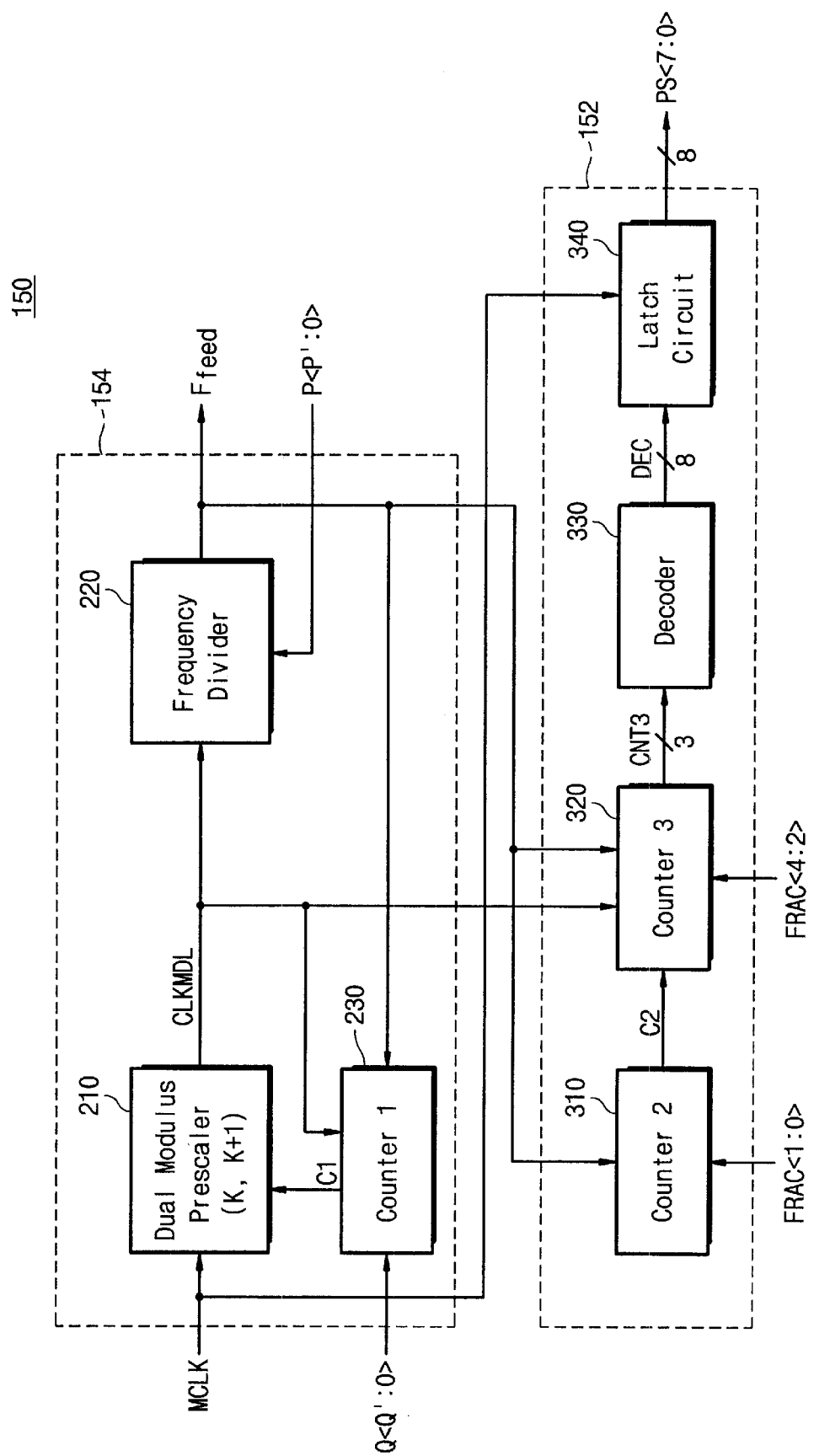
FIG. 5 is a block diagram illustrating a detailed configuration of a frequency divider of FIG. 2.

FIG. 5 is a block diagram illustrating a detailed configuration of the frequency divider 150 shown in FIG. 2. Referring to FIG. 5, the frequency divider 150 is composed of an integer frequency division logic circuit 154 generating a feedback signal Ffeed by dividing by an integer of a fractional divided clock signal MCLK provided from the VCO 140 in response to an integer frequency division ratio data P<P':0> and a counter critical value Q<Q':0>, and a fractional frequency division control logic circuit 152 generating the fractional frequency control data PS<7:0> in response to a fractional frequency division ratio data FRAC<4:0>.

The integer frequency division logic circuit 154 includes a dual modulus prescaler 210, a frequency divider 220, and a swallow counter 230. The dual modulus prescaler 210, in response to a control signal C1 generated at the swallow counter 230, outputs a divided clock signal CLKMDL by scaling down the clock signal MCLK provided by a fractional division by one of K and K+1 (K is a positive integer). The swallow counter 230 counts synchronously in response to the clock signal CLKMDL. If an internal count value CNT1 is less than the counter critical value Q<Q':0>, the swallow counter 230 outputs a control signal of a logic '1', and if the CNT1 is equal to or greater than the critical value Q<Q':0>, the counter 230 outputs a control signal of logic '0'. Thus, when the control signal C1 from the swallow counter 230 is '1', the dual modulus prescaler 210 divides the divided clock signal MCLK by frequency division ratio K+1, and when the C1 is '0', the dual modulus prescaler 210 divides the MCLK by the frequency division ratio K. The frequency divider 220 divides the CLKMDL provided from a divide-by-P<P':0>, and outputs the feedback signal Ffeed, resulting in resetting the counter 230.

A total integer frequency division ratio of the integer frequency division logic circuit 154 is determined by the division ratio K of the dual modulus prescaler 210, the integer frequency division ratio data P<P':0>, and the counter critical value Q<Q':0>, where the total integer frequency division ratio is N.

Figure 6A:
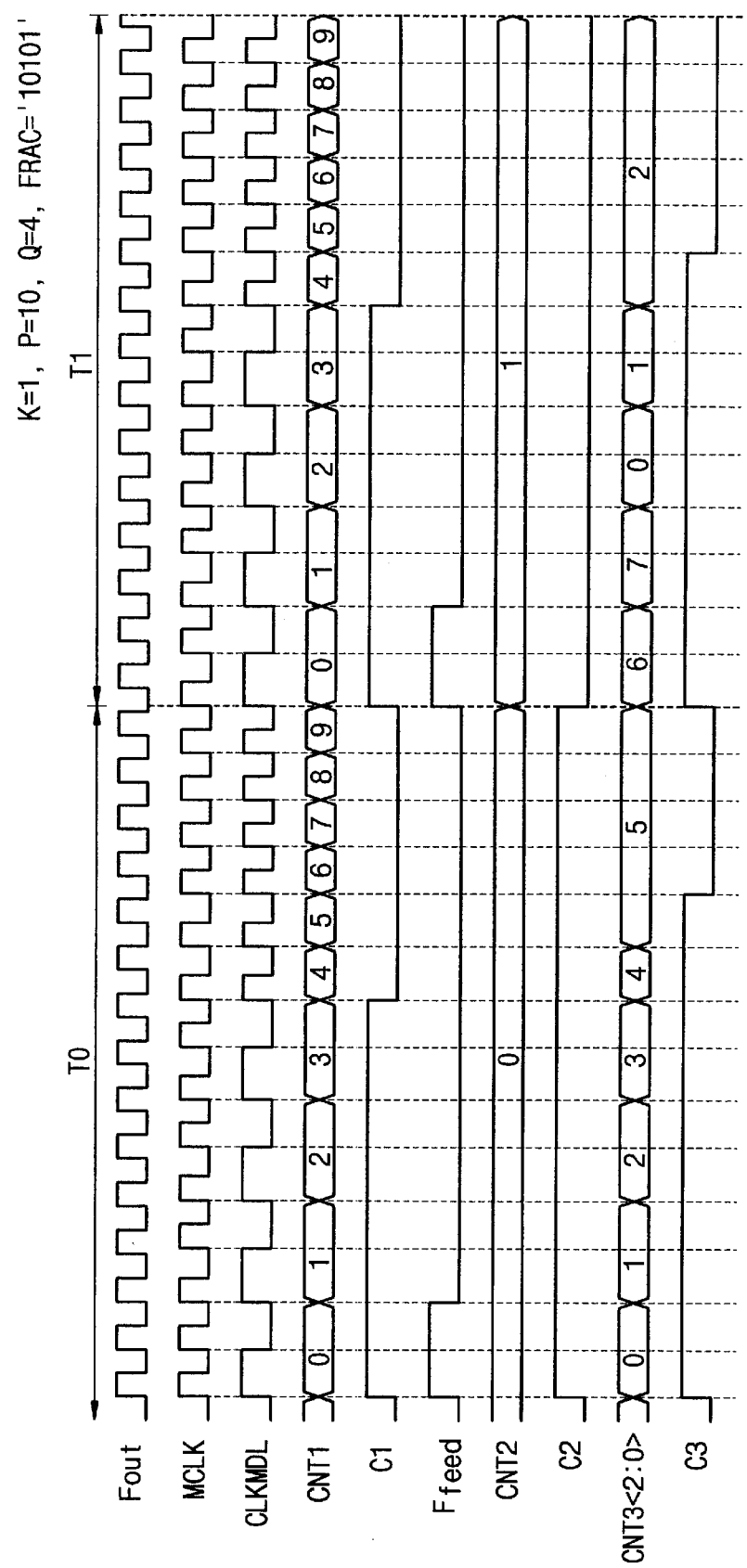
FIGS. 6A and 6B is timing diagrams illustrating signals of each unit in the PLL when the PLL of FIG. 2 operates under the predetermined conditions.
Figure 6B:
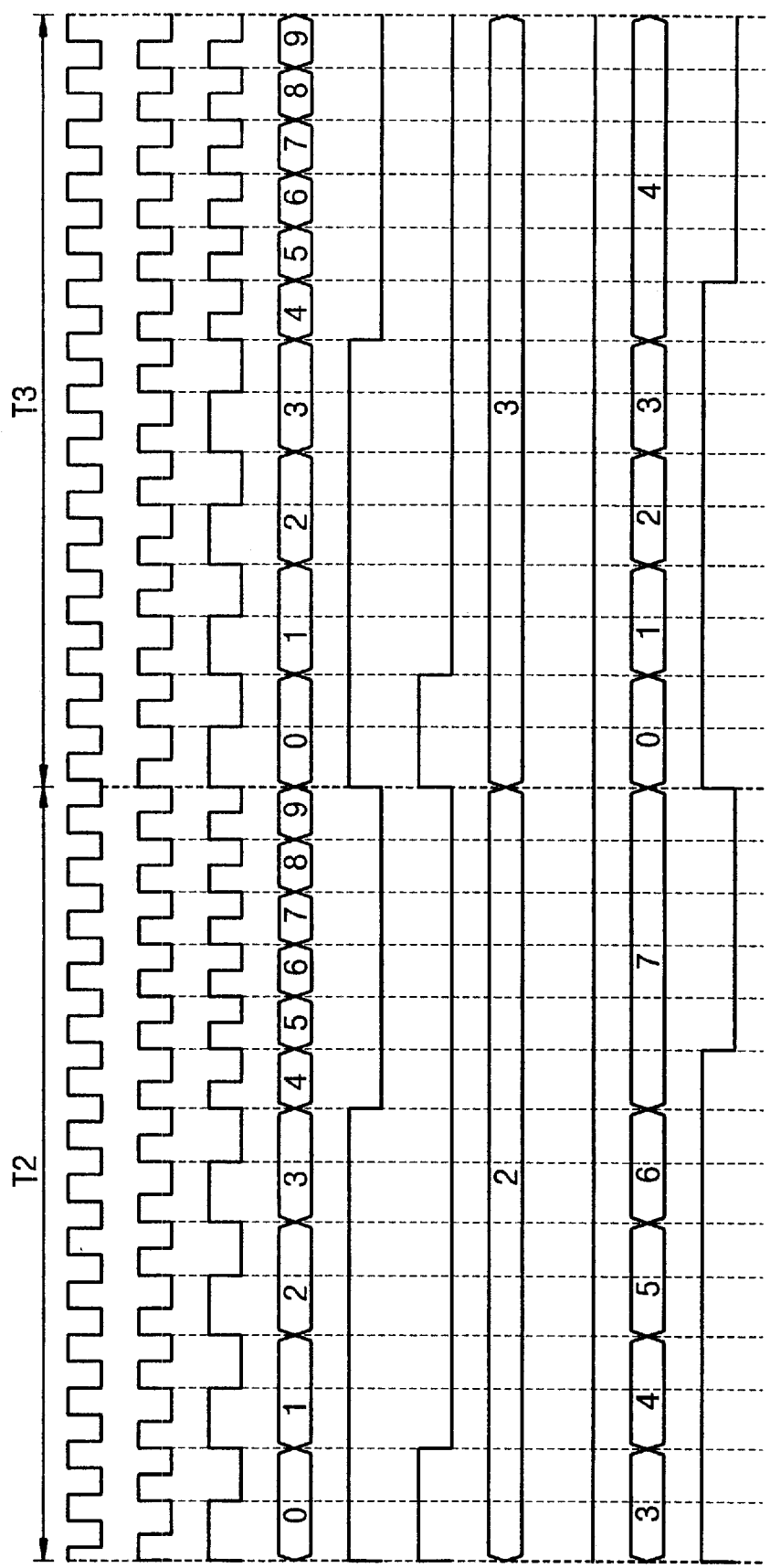

It is assumed that the division ratio K is equal to '1', the integer frequency division ratio data P<P':0> is equal to '10', and the counter critical value Q<Q':0> is equal to '4'. FIGS. 6A and 6B are timing diagrams illustrating each signal of the PLL circuit. As shown in FIGS. 6A and 6B, the total integer frequency division ratio N is '14'.

Referring again to FIG. 5, the fractional frequency division control logic circuit 152 is composed of counters 310 and 320, a decoder 330, and a latch circuit 340.

The counter 310 has 2 lower bits FRAC<1:0> of the fractional frequency division ratio data FRAC<4:0> as the critical value, and is formed of a two-bit modulo counter performing in synchronously response to the feedback signal Ffeed. The modulo counter has a similar operation mechanism to the swallow counter 230. That is, a count value CNT2 of the counter 310 changes as 0, 1, 2, and 3 i.e. binary number <00>, <01>, <10>, and <11>, respectively in synchronous response to the Ffeed signal. The counter 310 outputs a control signal C2 in accordance with the CNT2 and the critical value. If the count value CNT2 is smaller than the critical value FRAC<1:0>, the control signal C2 becomes logic '1'. On the contrary, if the CNT2 is greater than or equal to the FRAC<1:0>, then C2 becomes logic '0'.

The counter 320 as a 3-bit binary counter operates in synchronous response to the clock signal CLKMDL output from the dual modulus prescaler 210, and outputs 3-bit binary data CNT<2:0>. The counter 320 counts as many as the number of times corresponding to a value of the sum of the upper 3 bits FRAC<4:2> of the fractional division ratio data FRAC<4:0>. The counter 320 is automatically reset to binary number <000> at the next clock if its output count value becomes binary number <111>. In this embodiment, the counter 320 is designed to operate in synchronous response to the clock signal CLKMDL outputted from the dual modulus prescaler 210. The counter can operate in synchronous response to the clock signal MCLK provided by a fractional division. However, in this case, the division ratio P<P':0> of the frequency divider 220 and the critical value Q<Q':0> must be handled differently.

The decoder 330 outputs a 8-bit decoding signal DEC<7:0> by decoding the 3-bit count value CNT3<2:0> generated from the counter 320. As well known in the art, if the count value CNT3<2:0> is '0' (i.e. binary number <000>), the decoding signal DEC<7:0> is established to <00000001>. If the CNT3<2:0> is '1' (i.e. binary number <001>), the DEC<7:0> is <00000010>.

The latch circuit 340 generates the fractional division control data PS<7:0> from the decoding signal DEC<7:0> in synchronous response to the fractional divided clock signal MCLK. The PS<7:0> signal is supplied for turning on one of the eight switches SW0–SW7 composing the switch array 144. The latch circuit 340 is formed, for example, of eight D flip-flops (not shown) respectively corresponding to the bits of the decoding signal DEC<7:0>. Each D-flip-flop latches the bits corresponding the DEC<7:0> in synchronous response to the fractional divided clock signal MCLK.

Referring to FIGS. 5, 6A and 6B, the operation of the fractional frequency division control logic circuit 152 will now be described. If the fractional division ratio data FRAC<4:0> is a binary number <10101>, a critical value of the counter 310 is lower 2 bits FRAC<1:0> <01> of the FRAC<4:0>. Therefore, while the counter 310 generates the control signal C2 having logic '1' when the count value CNT2 is smaller than '1' (i.e. binary number <01>), the counter 310 generates the C2 signal having a value of logic '0' when the count value CNT is equal to or greater than '1'. Hence, during a first cycle T0 of the feedback signal Ffeed, the control signal C2 is logic '1', and after that, C2 is logic '0'.

The counter 320 counts as many as the number of times corresponding to a sum of the higher 3 bits FRAC<4:0> <101> of the fractional division ratio data FRAC<4:0> and the control signal C2 from the counter 310. Since the control signal C2 is logic '1' during the first cycle T0 of the feedback signal Ffeed, the counter 320 operates 6 times in total. If a final value of the counter 320 in a prior counting cycle has been '7' (i.e. binary number <111>), a final value of the CNT 3<2:0> becomes binary number <101> after the counting operations of 6 times during the first cycle T0 of the Ffeed signal, maintaining the final value of <101> until the Ffeed goes to a high level, logic '1'. Meanwhile, since the control signal C2 is logic '0' during a second cycle T1 of the Ffeed signal, the counter 320 operates 5 times in total, and thereby the final value of the CNT 3<2:0> becomes binary number <010>.

The latch circuit 340 synchronized with the fractional divided clock signal MCLK generates the fractional division control signal PS<7:0> from the count value CNT3<2:0> decoded by the decoder 330. Therefore, the switches SW0–SW7 of the switch array 144 are synchronized with the fractional divided clock signal MCLK, and are sequentially turned on in response to the count value CNT3<2:0> of the counter 320.

During the first cycle T0 of the feedback signal Ffeed, since the count value CNT3<2:0> of the counter 320 changes sequentially as <000>, <001>, <010>, <011>, <100>, and <101>, the switches SW0, SW1, SW2, SW3, SW4, and SW5 are sequentially turned on one by one. As a result, a phase is shifted 6 times, and its delay time is 6*ΔT, then a fractional division ratio M of the fractional divided clock signal MCLK will be (6×T)/8.

During the second cycle T1 of the feedback signal Ffeed, since the count value CNT3<2:0> changes sequentially as <110>, <111>, <000>, <001>, and <010>, the switches SW6, SW7, SW0, SW1, and SW2 are sequentially turned on. As a result, a phase is shifted 5 times, and its delay time is 5*ΔT, then a fractional division ratio M of the clock signal MCLK will be (5×T)/8.

During a third cycle T2 of the Ffeed, since the CNT3<2:0> changes sequentially as <011>, <100>, <101>, <110>, and <111>, the switches SW3, SW4, SW5, SW6, and SW7 are sequentially turned on. As a result, a phase is shifted 5 times, and its delay time is 5*ΔT, then a fractional division ratio M of the clock signal MCLK will be (5×T)/8.

Further, during a fourth cycle T3 of the Ffeed, since the CNT3<2:0> changes sequentially as <000>, <001>, <010>, <011>, and <100>, the switches SW0, SW1, SW2, SW3, and SW4 are sequentially turned on. As a result, a phase is shifted 5 times, and its delay time is 5*ΔT, then a fractional division ratio M of the clock signal MCLK will be (5×T)/8.

Delays from the first cycle T0 to the fourth cycle T3 of the Ffeed may be expressed as follows.

$$M = \frac{\frac{6 \times T}{8} + \frac{5 \times T}{8} + \frac{5 \times T}{8} + \frac{5 \times T}{8}}{4} = \frac{21 \times T}{32} \quad (3)$$

That is, total fraction division ratio M of the PLL circuit 100 is (21×T)/32. Since the integral division ratio N of the integer division logic circuit is '14', total division ratio of the PLL circuit 100 is N+M, that is, 14+(21×T)/32. Therefore, the reference signal Fref and the output signal Fout may be expressed as:

$$Fout = \left(14 + \frac{21 \times T}{32}\right) \times Fref \quad (4)$$

FIG. 7A to FIG. 7D are timing diagrams illustrating various signals of the PLL circuit in response to the fractional division ratio data, where the count value CNT3<2:0> of the counter 320 is a decimal number, and where the number in brackets expresses a number of times of counting operation.

Figure 7A:
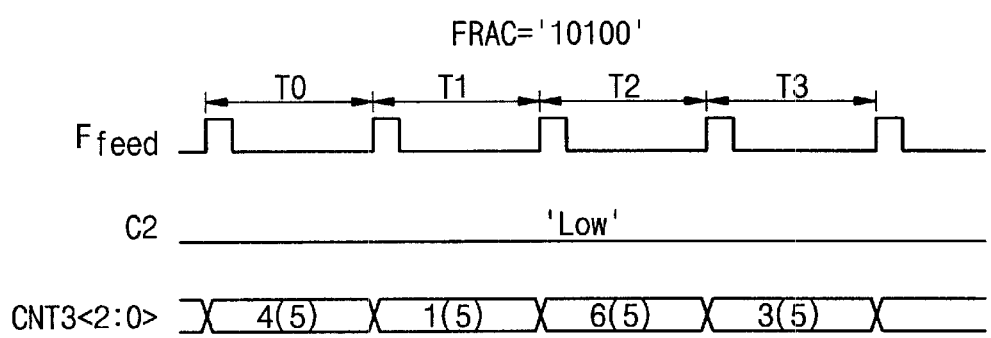
FIGS. 7A through 7D are timing diagrams illustrating each unit of the PLL of the present invention influenced by data of a fractional frequency division ratio.

FIG. 7A shows that the higher 3 bits FRAC<4:2> of the fractional division ratio data FRAC<4:0> are '5' (i.e. binary number <101>, and lower 2 bits FRAC<1:0> are '0' (i.e. binary number <00>. Since the FRAC<1:0> is '0', the control signal C1 generated from the counter 310 becomes logic '0' for the entire cycle of the feedback signal Ffeed. Therefore, from the first cycle T0 to the fourth cycle T3 of the Ffeed, the counter 320 operates 5 times every cycle. The final count values CNT3<2:0> of each cycle are '4', '1', '6', and '3', respectively. In this case, the fractional division ratio M of the PLL circuit 100 of the present invention is obtained as follows from equation (5).

$$M = \frac{\frac{5 \times T}{8} + \frac{5 \times T}{8} + \frac{5 \times T}{8} + \frac{5 \times T}{8}}{4} = \frac{20 \times T}{32} \quad (5)$$

Figure 7B:
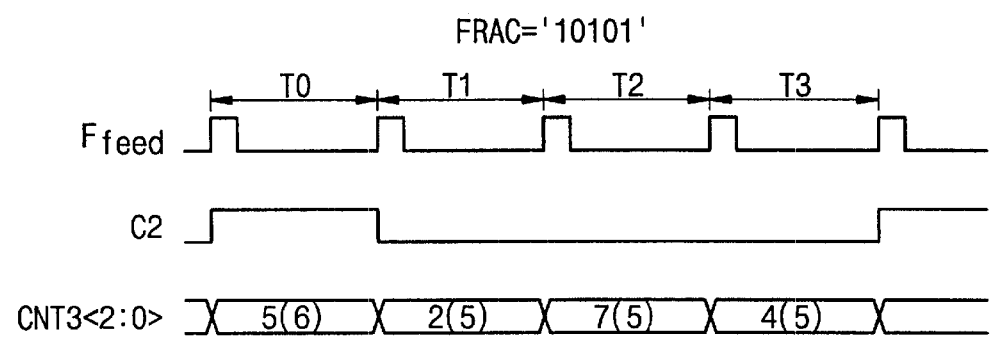

FIG. 7B shows that the higher 3 bits FRAC<4:2> of the fractional division ratio data FRAC<4:0> are '5' (i.e. binary number <101>), and the lower 2 bits FRAC<1:0> are '1' (i.e. binary number <01>). Since the FRAC<1:0> is '1', the control signal C1 generated from the counter 310 becomes logic '1' during the first cycle T0 of the Ffeed. From the second cycle T1 to the fourth cycle T3, the control signal C1 becomes logic '0'. Therefore, from the first cycle T0 to the fourth cycle T3 of the Ffeed, the counter 320 operates successively 6, 5, 5, and 5 times, respectively. The final count values CNT3<2:0> of each cycle are '5', '2', '7', and '4', respectively. In this case, the fractional division ratio M of the PLL circuit 100 is obtained as follows from equation (6).

$$M = \frac{\frac{6 \times T}{8} + \frac{5 \times T}{8} + \frac{5 \times T}{8} + \frac{5 \times T}{8}}{4} = \frac{21 \times T}{32} \quad (6)$$

Figure 7C:
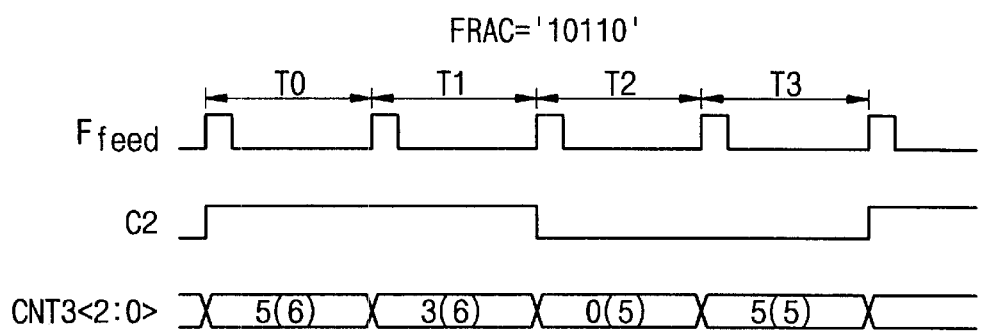

FIG. 7C shows that the higher 3 bits FRAC<4:2> of the fractional division ratio data FRAC<4:0> are '5' (i.e. binary number <101>), and the lower 2 bits FRAC<1:0> are '2' (i.e. binary number <10>). Since the FRAC<1:0> is '2', the control signal C1 generated from the counter 310 becomes logic '1' during the first cycle T0 and the second cycle T1 of the Ffeed. During the third cycle T2 and the fourth cycle T3, the control signal C1 becomes logic '0'. Therefore, from the first cycle T0 to the fourth cycle T3 of the Ffeed, the counter 320 operates successively 6, 6, 5, and 5 times, respectively. The final count values CNT3<2:0> of each cycle are '5', '3', '0', and '5', respectively. In this case, the fractional division ratio M of the PLL circuit 100 is obtained as follows from equation (7).

$$M = \frac{\frac{6 \times T}{8} + \frac{6 \times T}{8} + \frac{5 \times T}{8} + \frac{5 \times T}{8}}{4} = \frac{22 \times T}{32} \quad (7)$$

Figure 7D:
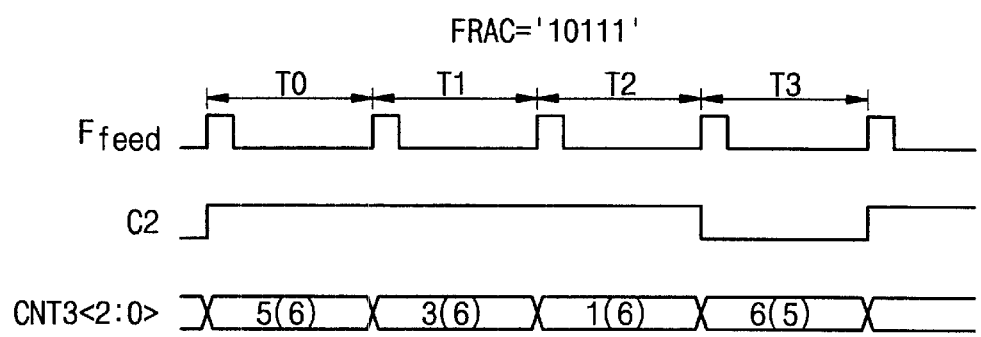

Finally, FIG. 7D shows that the higher 3 bits FRAC<4:2> of the fractional division ratio data FRAC<4:0> are '5' (i.e. binary number <101>), and the lower 2 bits FRAC<1:0> are '3' (i.e. binary number <11>). Since the FRAC<1:0> is '3', the control signal C1 generated from the counter 310 becomes logic '1' during from the first cycle T0 to the third cycle T2 of the Ffeed. The fourth cycle T3, the control signal C1 becomes logic '0'. Therefore, from the first cycle T0 to the fourth cycle T3 of the Ffeed, the counter 320 operates successively 6, 6, 6, and 5 times, respectively. The final count values CNT3<2:0> of each cycle are '5', '3', '1', and '6', respectively. In this case, the fractional division ratio M of the PLL circuit 100 is obtained as follows from equation (8).

$$M = \frac{\frac{6 \times T}{8} + \frac{6 \times T}{8} + \frac{6 \times T}{8} + \frac{5 \times T}{8}}{4} = \frac{23 \times T}{32} \quad (8)$$

TABLE 1

| FRAC<4:2> | FRAC<1:0> | Fractional frequency division ratio M |
|---|---|---|
| 000 | 00 | 0 |
| 000 | 01 | $\frac{1}{32}$ |
| 000 | 10 | $\frac{2}{32}$ |
| 000 | 11 | $\frac{3}{32}$ |
| 001 | 00 | $\frac{4}{32}$ |
| 001 | 01 | $\frac{5}{32}$ |
| 001 | 10 | $\frac{6}{32}$ |
| 001 | 11 | $\frac{7}{32}$ |
| 010 | 00 | $\frac{8}{32}$ |
| . | . | . |
| . | . | . |
| . | . | . |
| 111 | 00 | $\frac{28}{32}$ |
| 111 | 01 | $\frac{29}{32}$ |
| 111 | 10 | $\frac{30}{32}$ |

TABLE 1-continued

| FRAC<4:2> | FRAC<1:0> | Fractional frequency division ratio M |
|---|---|---|
| 111 | 00 | $\frac{31}{32}$ |

Table 1 shows a decimal fractional division ratio corresponding to binary fractional division ratio data. As shown the table, 5-bit binary fractional division ratio data FRAC<4:0> corresponds to 32 numbers of the decimal fractional division ratios (i.e. From 0 to 31/32), respectively.

In the PLL circuit of the embodiment, if a frequency of the reference signal Fref, the integer division ratio N, and the fractional division ratio M are set at 8 MHz, 129, and 11/32, respectively, a frequency of the output signal Fout is expected 1.03475 GHz in theory. As the result of operating the PLL circuit in accordance with the preferred embodiment, an average frequency of the Fout was 1.0347 GHz, timing jitter Tpkpk is 5 pS, and total lock time is within 10 uS.

While the invention has been described in conjunction with specific embodiments thereof, it is evident that many alterations, modifications, and variations will be apparent to those skilled in the art in light of the foregoing description. Accordingly, it is intended to embrace all such alterations, modifications, and variations in the appended claims.

According to the above embodiments, the PLL circuit uses the phase interpolation method. However, by limiting the number of delay signals to 8 and by using the phase accumulation method during the four cycles of the feedback signal in response to the fractional division ratio data, it is possible to perform the divide-by-fraction F/32 (F=0, 1, 2, . . . , 31). According to the present invention, the substrate noise is decreased in comparison with the phase interpolation method using 32 numbers of delay signals, and the PLL circuit is insensitive to physical error. While the phase accumulation method of accumulating the phases during 32 cycles is in need of an additional compensating circuit so as to minimized fractional spurious, the PLL circuit of the present invention does not require the additional compensating circuit by employing a method accumulating phases during four cycles.

What is claimed is:

1. A phase locked loop (PLL) circuit for a fractional frequency division synthesizer, comprising:

a voltage controlled oscillator (VCO) for generating an output signal of a frequency proportional to a predetermined frequency control voltage, and for generating a clock signal delayed by a time period corresponding to a fractional division control data signal;

an integer division logic circuit for generating a feedback signal by dividing the delayed clock signal supplied by the VCO in response to an external integer division ratio data and a predetermined division ratio;

a phase comparator for detecting a phase error between an input signal and the feedback signal, and for generating a phase error signal corresponding to the phase error;

a charge pump circuit for generating a charge pump output current corresponding to the phase error signal; and a loop filter for converting the charge pump output current to the frequency control voltage.

2. The circuit of claim 1, wherein said delayed clock signal generated from the VCO is formed of a fraction of the clock signal.

3. The circuit of claim 2, wherein said VCO comprises:
an oscillator for generating an output signal of a frequency in proportion to the frequency control voltage, and for generating $2^Y$ delay signals (where Y is a positive integer) delayed by a predetermined time with respect to the output signal; and
a switching circuit for generating the delayed clock signal from one of the $2^Y$ delay signals in response to the fractional division control data.

4. The circuit of claim 3, wherein the delay signals have delay times that are equal, and the sum of delay times of the delay signals is equal to a cycle of the output signal.

5. The circuit of claim 3, wherein only one of said $2^Y$ fractional division control data bits has a value of logic '1' exclusively.

6. The circuit of claim 5, wherein said switching circuit is composed of $2^Y$ switches respectively corresponding to the delay signals generated from the oscillator, where each switch is controlled by the corresponding fractional division control data bit, and transmits the delay signal generated from the oscillator to the delayed clock signal.

7. The circuit of claim 3, wherein said fractional division ratio data comprises X bits (where X is a positive integer).

8. The circuit of claim 7, wherein said fractional division control logic circuit comprises:
a second counter for performing a counting operation in synchronous response to the feedback signal, for comparing an internal count value with a higher (X-Y) bit of the fractional division ratio data, resulting in generation of a second control signal;
a third counter for performing counting operations a number of times corresponding to a value of the sum of the second control signal and a lower Y bit of the fractional division ratio data, and thereby generating a count value;
a decoder for generating a decoding data from the count value of the third counter; and
a latch circuit for generating, in synchronous response to the delayed clock signal, the fractional division control data from the decoding data.

9. The circuit of claim 7, wherein said second counter generates the second control signal at a value of logic '1' if the internal count value is lower than the higher (X-Y) bit of the fractional division ratio data, and for generating the second control signal at a value of logic '0' if the internal count value is equal to or greater than the higher (X-Y) bit.

10. The circuit of claim 2, wherein said integer division logic circuit, comprises:
a dual modulus prescaler for selecting one of predetermined plural division ratios in response to a first control signal, for dividing the clock signal divided by the selected division ratio, and for generating a first division signal;
a frequency divider for dividing the first division signal in response to the integer division ratio data, and for generating the feedback signal; and
a first counter for performing counting operations in synchronous response to the feedback signal, for comparing the internal count value with a critical value supplied from external sources, and thereby generating the first control signal.

11. The circuit of claim 10, wherein said first counter generates the first control signal having logic '1' if the internal count value is lower than the critical value supplied from external sources, and generates the first control signal having logic '0' if the internal count value is equal to or greater than the critical value.

12. The circuit of claim 11, wherein said first counter is formed of a swallow counter.

13. The circuit of claim 7, wherein said fractional division control logic circuit comprises:
a second counter for performing a counting operation in synchronous response to the feedback signal, for comparing an internal count value with a higher (X-Y) bit of the fractional division ratio data, resulting in generation of a second control signal;
a third counter for performing counting operations as many as times as a sum of the second control signal and a lower Y bits of the fractional division ratio data in synchronous response to the first division signal, and thereby generating a count value;
a decoder for generating a decoding data from the third counter; and
a latch circuit for generates the fractional division control data from the decoding data in synchronous response to the delayed clock signal.

14. The circuit of claim 13, wherein said second counter generates the second control signal of logic value '1' if the internal count value is lower than the higher (X-Y) bit of the fractional division ratio data, and generates the second control signal of logic value '0' if the internal count value is equal to or greater than the higher (X-Y) bit.

15. The circuit of claim 10, wherein said fractional division control logic circuit comprises:
a second counter for performing a counting operation in synchronous response to the feedback signal, for comparing an internal count value with a higher (X-Y) bit of the fractional division ratio data, resulting in generation of a second control signal;
a third counter for performing counting operations as many as times as a sum of the second control signal and a lower Y bits of the fractional division ratio data in synchronous response to the first division signal, and thereby generating a count value;
a decoder for generating a decoding data from the third counter; and a latch circuit for generates the fractional division control data from the decoding data in synchronous response to the delayed clock signal.

16. The circuit of claim 15, wherein said second counter generates the second control signal of logic '1' if the internal count value is lower than the higher (X-Y) bit of the fractional division ratio data, and generates the second control signal of logic '0' if the internal count value is equal to or greater than the higher (X-Y) bit.

* * * * *